United States Patent
Chen et al.

(10) Patent No.: US 11,581,795 B2
(45) Date of Patent: Feb. 14, 2023

(54) CURRENT SENSING CIRCUIT FOR GENERATING SENSED CURRENT SIGNAL WITH AVERAGE VALUE BEING CONSTANT UNDER DIFFERENT INPUT VOLTAGES OF DIRECT CURRENT TO DIRECT CURRENT CONVERTER AND ASSOCIATED CURRENT-MODE CONTROL CIRCUIT

(71) Applicant: MEDIATEK INC., Hsin-Chu (TW)

(72) Inventors: Wei-Chung Chen, Hsinchu (TW); Kuo-Chun Hsu, Hsinchu (TW)

(73) Assignee: MEDIATEK INC., Hsin-Chu (TW)

(*) Notice: Subject to any disclaimer, the term of this patent is extended or adjusted under 35 U.S.C. 154(b) by 43 days.

(21) Appl. No.: 17/368,782

(22) Filed: Jul. 6, 2021

(65) Prior Publication Data

US 2022/0029520 A1    Jan. 27, 2022

Related U.S. Application Data

(60) Provisional application No. 63/054,842, filed on Jul. 22, 2020.

(51) Int. Cl.
*H02M 3/156* (2006.01)
*H02M 1/00* (2006.01)
*G01R 15/14* (2006.01)

(52) U.S. Cl.
CPC ........ *H02M 1/0009* (2021.05); *G01R 15/146* (2013.01); *H02M 3/156* (2013.01)

(58) Field of Classification Search
None
See application file for complete search history.

(56) References Cited

U.S. PATENT DOCUMENTS

| | | | |
|---|---|---|---|
| 4,987,361 A | 1/1991 | Ohms | |
| 7,425,819 B2 * | 9/2008 | Isobe | H02M 3/156 323/299 |

(Continued)

FOREIGN PATENT DOCUMENTS

| | | |
|---|---|---|
| TW | 201136109 A1 | 10/2011 |
| TW | 201136120 A1 | 10/2011 |
| TW | 201722056 A | 6/2017 |

OTHER PUBLICATIONS

Liu, "CCM Noninverting Buck-Boost Converter With Fast Duty-Cycle Calculation Control for Line Transient Improvement", IEEE Transactions on Power Electronics, vol. 33, No. 6, pp. 5097-5107, Jun. 2018.

(Continued)

*Primary Examiner* — Jeffrey A Gblende
(74) *Attorney, Agent, or Firm* — Winston Hsu (57) ABSTRACT

A current sensing circuit includes an inductor current sensing circuit and a processing circuit. The inductor current sensing circuit senses an inductor current of a direct current to direct current (DC-to-DC) converter to generate a first sensed current signal, wherein an average value of the first sensed current signal is not a constant under different input voltages of the DC-to-DC converter. The processing circuit generates a second sensed current signal, wherein the first sensed current signal is involved in generation of the second sensed current signal, the second sensed current signal is involved in current-mode control of the DC-to-DC converter, and an average value of the second sensed current signal is a constant under said different input voltages of the DC-to-DC converter.

14 Claims, 6 Drawing Sheets

(56) References Cited

U.S. PATENT DOCUMENTS

| | | | |
|---|---|---|---|
| 8,829,879 B2* | 9/2014 | Latham, II | H02M 3/156 323/285 |
| 10,170,985 B1* | 1/2019 | Wu | H02M 3/156 |
| 2013/0328534 A1* | 12/2013 | Hsieh | H02M 3/1588 323/271 |

OTHER PUBLICATIONS

Huang, "Hybrid Buck-Boost Feedforward and Reduced Average Inductor Current Techniques in Fast Line Transient and High-Efficiency Buck-Boost Converter", IEEE Transactions on Power Electronics, vol. 25, No. 3, pp. 719-730, Mar. 2010.

Richard Redl et al., Near-Optimum Dynamic Regulation of DC-DC Converters Using Feed-Forward of Output Current and Input Voltage with Current-Mode Control, IEEE Transactions on Power Electronics, vol. PE-1, No. 3, Jul. 1986, IEEE, pp. 181-192, XP011242282, Jul. 1986.

Yushan Li et al., Current Mode Control for Boost Converters With Constant Power Loads, IEEE Transactions on Circuits and Systems—I: Regular Papers, vol. 59, No. 1, Jan. 2012, IEEE, pp. 198-206, XP011391862, Jan. 2012.

\* cited by examiner

CURRENT SENSING CIRCUIT FOR GENERATING SENSED CURRENT SIGNAL WITH AVERAGE VALUE BEING CONSTANT UNDER DIFFERENT INPUT VOLTAGES OF DIRECT CURRENT TO DIRECT CURRENT CONVERTER AND ASSOCIATED CURRENT-MODE CONTROL CIRCUIT

CROSS REFERENCE TO RELATED APPLICATIONS

This application claims the benefit of U.S. provisional application No. 63/054,842, filed on Jul. 22, 2020 and incorporated herein by reference.

BACKGROUND

The present invention relates to a direct current to direct current (DC-to-DC) converter design, and more particularly, to a current sensing circuit for generating a sensed current signal with an average value being a constant under different input voltages of a DC-to-DC converter and an associated current-mode control circuit.

Portable battery-operated devices are more and more popular today. For these devices such as a smartphone, a tablet, and a wearable device, light weight and long battery run-time are the main demands. The battery module has become a main portion in space and weight of these portable devices. Generally, a display panel of a portable device is powered by the battery module through a DC-to-DC converter. For example, the display panel may be an active-matrix organic light-emitting diode (AMOLED) panel, and an inverting buck-boost converter may be employed to provide the AMOLED panel with a needed negative voltage that is converted from a positive supply voltage of the battery module. Hence, the display quality of the display panel depends on the line regulation/transient performance of the DC-to-DC converter. With regard to the DC-to-DC converter, a pulse-width modulation (PWM) technique is generally used to control the output voltage. In a case where a typical voltage-mode PWM control scheme is employed, the DC-to-DC converter can have good line transient performance, but requires high compensation hardware cost. In another case where a typical current-mode PWM control scheme is employed, the DC-to-DC converter can save the compensation hardware cost, but suffers from poor line regulation/transient performance.

Thus, there is a need for an advanced current-mode PWM control scheme which enables the DC-to-DC converter to benefit from low compensation hardware cost of current-mode PWM control while maintaining good line regulation/transient performance.

SUMMARY

One of the objectives of the claimed invention is to provide a current sensing circuit for generating a sensed current signal with an average value being a constant under different input voltages of a DC-to-DC converter and an associated current-mode control circuit.

According to a first aspect of the present invention, an exemplary current sensing circuit is disclosed. The exemplary current sensing circuit includes an inductor current sensing circuit and a processing circuit. The inductor current sensing circuit is arranged to sense an inductor current of a direct current to direct current (DC-to-DC) converter to generate a first sensed current signal, wherein an average value of the first sensed current signal is not a constant under different input voltages of the DC-to-DC converter. The processing circuit is arranged to generate a second sensed current signal, wherein the first sensed current signal is involved in generation of the second sensed current signal, the second sensed current signal is involved in current-mode control of the DC-to-DC converter, and an average value of the second sensed current signal is a constant under the different input voltages of the DC-to-DC converter.

According to a second aspect of the present invention, an exemplary current-mode control circuit of a direct current to direct current (DC-to-DC) converter is disclosed. The exemplary current-mode control circuit includes an error amplifier circuit, a current sensing circuit, a ramp generator circuit, a first combining circuit, and a comparator circuit. The error amplifier circuit is arranged to receive a feedback voltage of the DC-to-DC converter and a reference voltage, and generate an error signal according to the feedback voltage and the reference voltage. The current sensing circuit includes an inductor current sensing circuit and a processing circuit. The inductor current sensing circuit is arranged to sense an inductor current of the DC-to-DC converter to generate a first sensed current signal, wherein an average value of the first sensed current signal is not a constant under different input voltages of the DC-to-DC converter. The processing circuit is arranged to generate a second sensed current signal, wherein the first sensed current signal is involved in generation of the second sensed current signal, and an average value of the second sensed current signal is a constant under the different input voltages of the DC-to-DC converter. The ramp generator circuit is arranged to generate a ramp signal. The first combining circuit is arranged to combine the second sensed current signal and the ramp signal to generate a summing signal. The comparator circuit is arranged to receive the error signal and the summing signal, and generate a control signal according to the error signal and the summing signal, wherein an output voltage of the DC-to-DC converter depends on the control signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
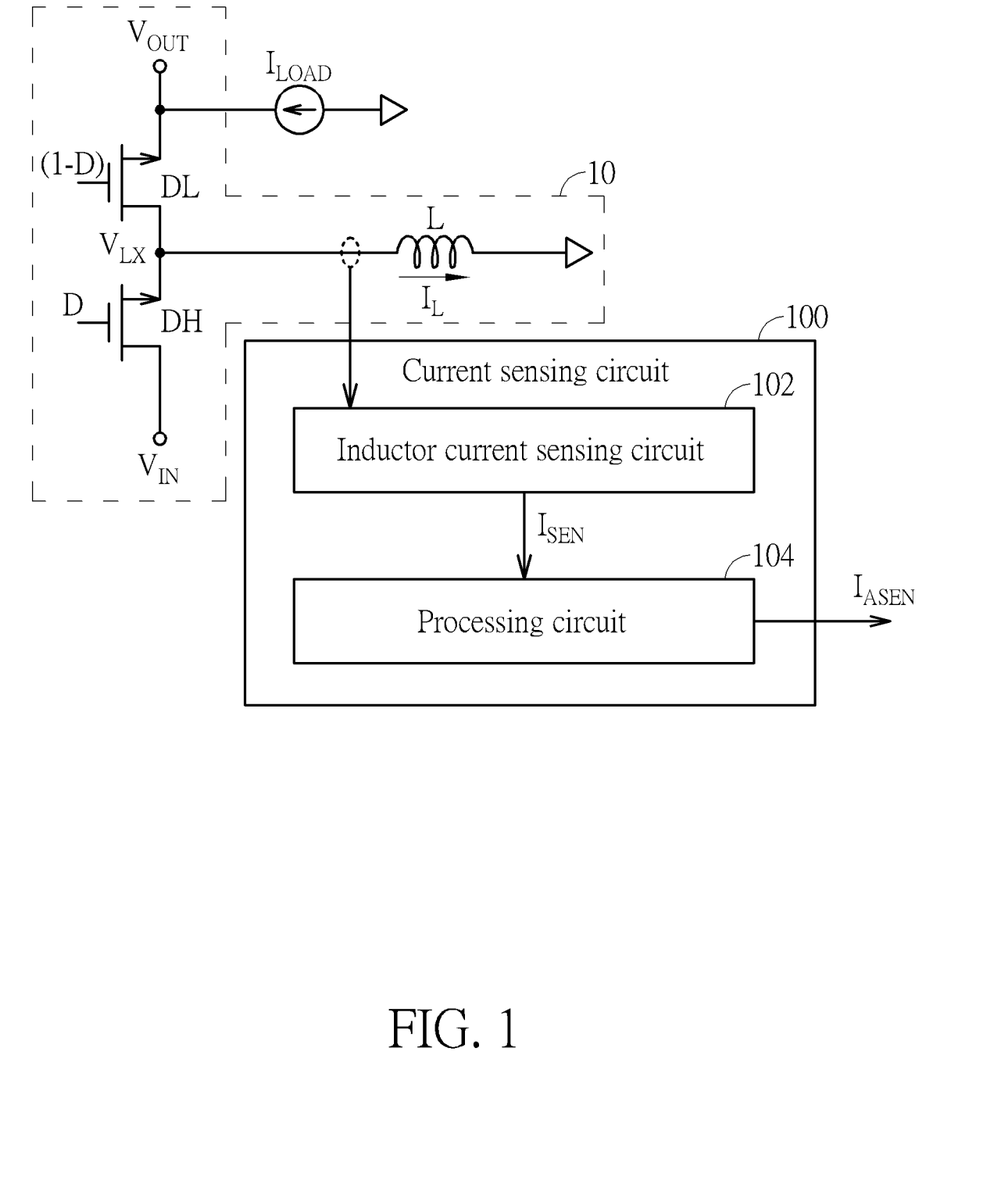
FIG. 1 is a block diagram illustrating a current sensing circuit according to an embodiment of the present invention.

FIG. 1 is a block diagram illustrating a current sensing circuit according to an embodiment of the present invention. The current sensing circuit 100 may be used for achieving advanced current-mode PWM control proposed by the present invention. In contrast to the typical current-mode PWM control, the advanced current-mode PWM control enables a DC-to-DC converter to benefit from low compensation hardware cost of current-mode PWM control while maintaining good line regulation/transient performance. As shown in FIG. 1, the current sensing circuit 100 may include an inductor current sensing circuit 102 and a processing circuit 104. The inductor current sensing circuit 102 is arranged to sense an inductor current $I_L$ of an inductor L in a DC-to-DC converter (e.g., an inverting buck-boost converter that has a power stage 10 for generating a negative output voltage $V_{OUT}$ according to a positive input voltage $V_{IN}$, and for providing a constant load current $I_{LOAD}$ that is drawn by a load device) to generate one sensed current signal $I_{SEN}$, wherein an average value of the sensed current signal $I_{SEN}$ is not a constant under different input voltages $V_{IN}$ of the DC-to-DC converter. For example, the inductor current sensing circuit 102 may be implemented by a current sensing amplifier used to sense the inductor current $I_L$ when the metal-oxide-semiconductor (MOS) transistor DH (which acts as a high-side switch) is turned on and the MOS transistor DL (which acts as a low-side switch) is turned off. The sensed current signal $I_{SEN}$ may be expressed in "voltage" form or "current" form, depending upon actual design consideration.

The processing circuit 104 is arranged to generate another sensed current signal $I_{ASEN}$ as an sensing output of the current sensing N circuit 100, wherein the sensed current signal $I_{SEN}$ is involved in generation of the sensed current signal $I_{ASEN}$, the sensed current signal $I_{ASEN}$ is involved in current-mode control of the DC-to-DC converter (particular, current-mode PWM control of MOS transistors DH and DL in the DC-to-DC converter), and an average value of the sensed current signal $I_{ASEN}$ is a constant under the different input voltages $V_{IN}$ of the DC-to-DC converter. In contrast to the typical current-mode PWM control that directly uses the sensed current signal $I_{SEN}$, the advanced current-mode PWM control proposed by the present invention uses the sensed current signal $I_{ASEN}$ Further details of the advanced current-mode PWM control are described below with reference to the accompanying drawings.

Figure 2:
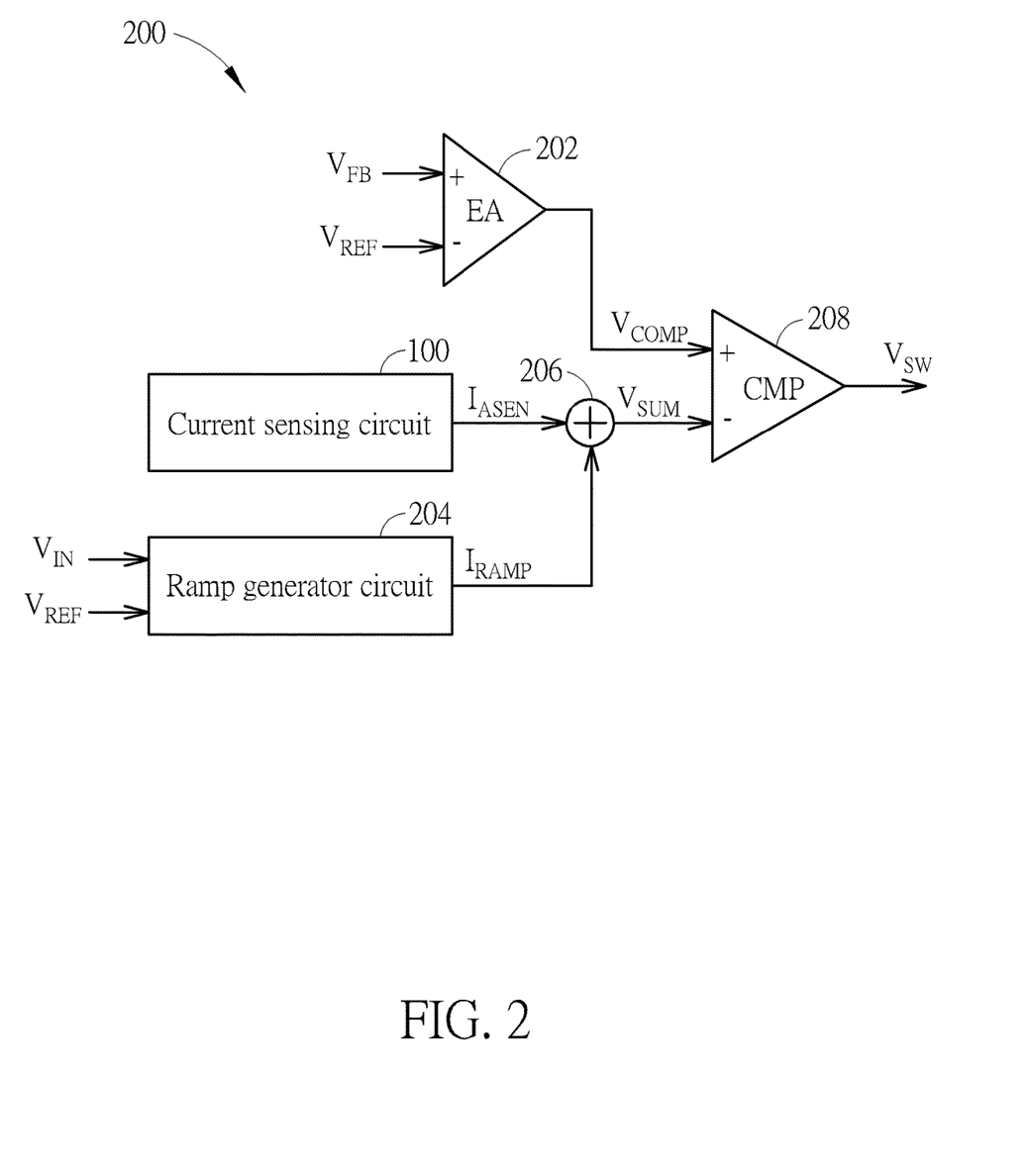
FIG. 2 is a current-mode control circuit of a DC-to-DC converter according to an embodiment of the present invention.

FIG. 2 is a current-mode control circuit of a DC-to-DC converter according to an embodiment of the present invention. For example, the current-mode control circuit 200 may be a current-mode PWM controller, and/or may be employed by an inverting buck-boost converter having the power stage 10 shown in FIG. 1. The current-mode control circuit 200 may include the current sensing circuit 100 shown in FIG. 1, and may further include an error amplifier circuit (labeled by "EA") 202, a ramp generator circuit 204, a combining circuit 206, and a comparator circuit (labeled by "CMP") 208. The error amplifier circuit 202 is arranged to receive a feedback voltage $V_{FB}$ and a reference voltage $V_{REF}$, and generate an error signal $V_{COMP}$ according to the feedback voltage $V_{FB}$ and the reference voltage $V_{REF}$. For example, the feedback voltage $V_{FB}$ may be obtained from dividing the output voltage $V_{OUT}$ of the DC-to-DC converter through a voltage divider. The comparison result decides the voltage level of the error signal $V_{COMP}$.

The ramp generator circuit 204 is arranged to generate a ramp signal $I_{RAMP}$ that has a periodic sawtooth or triangle waveform. For example, the ramp generator circuit 204 may refer to the input voltage $V_{IN}$ and the reference voltage $V_{REF}$ to generate the ramp signal $I_{RAMP}$ with a dynamic slope. The combining circuit 206 is arranged to combine the sensed current signal $I_{ASEN}$ and the ramp signal $I_{RAMP}$ to generate a summing signal $V_{SUM}$ (i.e. $V_{SUM}=I_{ASEN}+I_{RAMP}$). For example, the summing signal $V_{SUM}$ may be expressed in "voltage" form. It should be noted that, if the sensed current signal $I_{ASEN}$ and the ramp signal $I_{RAMP}$ are expressed in "current" form, the combining circuit 206 may be equipped with a current-to-voltage conversion function for generating the summing signal $V_{SUM}$.

The comparator circuit 208 is arranged to receive the error signal $V_{COMP}$ and the summing signal $V_{SUM}$, and generate a control signal $V_{SW}$ (which is a comparator output) according to the error signal $V_{COMP}$ and the summing signal $V_{SUM}$. The control signal $V_{SW}$ is a PWM control signal, and determines on-time period $t_{ON}$ and off-time period $t_{OFF}$ of the MOS transistor DH, where the duty cycle D is defined by $$D = \frac{t_{ON}}{t_{ON} + t_{OFF}}.$$

Hence, the output voltage $V_{OUT}$ of the DC-to-DC converter depends on the control signal $V_{SW}$.

Since the present invention focuses on the innovative design of the current sensing circuit 100 and the error amplifier circuit 202, the ramp generator circuit 204, the combining circuit 206 and the comparator circuit 208 may be implemented using any known designs, further description of the error amplifier circuit 202, the ramp generator circuit 204, the combining circuit 206 and the comparator circuit 208 is omitted here for brevity.

Figure 3:
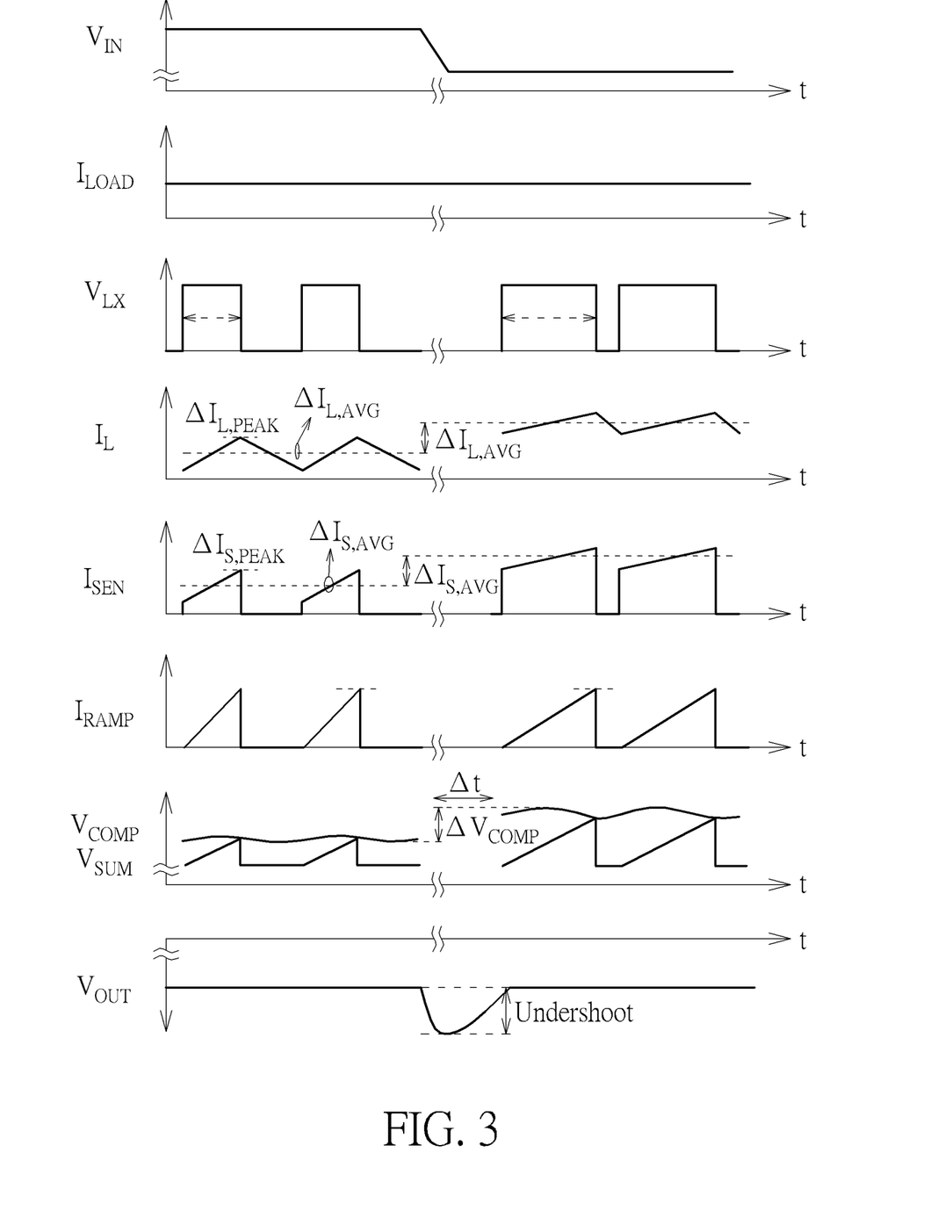
FIG. 3 is a diagram illustrating waveforms of different signals of a DC-to-DC converter under a condition of $V_{SUM}=I_{SEN}+I_{RAMP}$.

The typical current-mode PWM control directly uses the sensed current signal $I_{SEN}$. As a result, a DC-to-DC converter using the typical current-mode PWM control has poor line transient performance as well as poor line regulation performance. Consider a case that the current sensing circuit 100 is modified to output the sensed current signal $I_{SEN}$, instead of the proposed sensed current signal $I_{ASEN}$. As a result, the summing signal $V_{SUM}$ ($V_{SUM}=I_{SEN}+I_{RAMP}$) is output from the combining circuit 206. FIG. 3 is a diagram illustrating waveforms of different signals of a DC-to-DC converter under a condition of $V_{SUM}=I_{SEN}+I_{RAMP}$. The input voltage $V_{IN}$ may be supplied by a battery device that is shared by multiple components in the same portable device. Hence, the input voltage $V_{IN}$ may suffer from an input voltage disturbance or transient caused by one or more of the components. Suppose that the DC-to-DC converter is an inversing buck-boost converter that operates under a continuous-conduction mode (CCM). Hence, the duty cycle D may be represented by $$D = \frac{-V_{OUT}}{V_{IN} - V_{OUT}},$$

where the input voltage $V_{IN}$ is a positive voltage (i.e. $V_{IN} > 0V$), and the output voltage $V_{OUT}$ is a negative voltage (i.e. $V_{OUT} < 0V$). In addition, the average value $I_{L,AVG}$ of the inductor current $I_L$ may be expressed as $$I_{L,AVG} = \frac{I_{LOAD}}{1-D},$$

where the load current $I_{LOAD}$ drawn from the load device (e.g., AMOLED panel) has a fixed current value regardless of the input voltage $V_{IN}$.

As shown in FIG. 3, when the input voltage $V_{IN}$ has an input voltage disturbance or transient (e.g., a transition from a current voltage level to a lower voltage level), the current-mode PWM control is operative to increase the duty cycle D for the same output voltage $V_{OUT}$. Hence, the peak value $I_{L,PEAK}$ and the average value $I_{L,AVG}$ of the inductor current $I_L$ are both increased due to a larger duty cycle D. Since the sensed current signal $I_{SEN}$ is derived from sensing the inductor current $I_L$ (particularly, sensing the inductor current $I_L$ during the on-time period $t_{ON}$ of the MOS transistor DH), the peak value $I_{S,PEAK}$ and the average value $I_{S,AVG}$ of the sensed current signal $I_{SEN}$ are both increased, where the average value $I_{S,AVG}$ of the sensed current signal $I_{SEN}$ is positively correlated with the average value $I_{L,AVG}$ of the inductor current $I_L$. The duty cycle D depends on comparison of error signal $V_{COMP}$ and summing signal $V_{SUM}$, where an end point of one on-time period $t_{ON}$ of the MOS transistor DH may be aligned with a time point when a peak value of the summing signal $V_{SUM}$ reaches the error signal $V_{COMP}$. The relation between error signal $V_{COMP}$ and summing signal $V_{SUM}$ ($V_{SUM} = I_{SEN} + I_{RAMP}$) may be expressed by the following formula, where $$I_{L,AVG} = \frac{I_{LOAD}}{1-D}. \quad (1)$$

$$\begin{aligned} V_{COMP} &= V_{SUM} \\ &= I_{RAMP} + I_{SEN(PEAK)} \\ &= I_{RAMP} + \frac{I_{L,PP}}{2} + I_{L,AVG} \\ &= I_{RAMP} + \frac{I_{L,PP}}{2} + \frac{I_{LOAD}}{1-D} \end{aligned}$$

In above formula (1), $I_{L,PP}$ represents peak-to-peak ripple current amplitude of the inductor current $I_L$. Since the current-mode PWM control is operative to increase the duty cycle D in response to the input voltage $V_{IN}$ having a transition from a current voltage level to a lower voltage level, the variation $\Delta I_{L,AVG}$ of the inductor current $I_L$, the variation $\Delta I_{S,AVG}$ of the sensed current signal $I_{SEN}$, and the variation $\Delta V_{COMP}$ of the error signal $V_{COMP}$ are all large. Specifically, the duty cycle D is adjusted in response to the variation of the input voltage $V_{IN}$. The factor $$\frac{I_{L,PP}}{2}$$

has negligible impact on the variation $\Delta V_{COMP}$ of the error signal $V_{COMP}$, and an average value of $$\frac{I_{L,PP}}{2}$$

may be treated as a constant under different input voltages of the DC-to-DC converter. However, the factor $$\frac{I_{LOAD}}{1-D}$$

(i.e. $I_{L,AVG}$) dominates the variation $\Delta V_{COMP}$ of the error signal $V_{COMP}$ (i.e., $\Delta V_{COMP} \approx \Delta I_{L,AVG}$), and an average value of $$\frac{I_{LOAD}}{1-D}$$

is not a constant under different input voltages of the DC-to-DC converter. When the input voltage $V_{IN}$ has an input voltage disturbance or transient, the large variation $\Delta V_{COMP}$ within the time period $\Delta t$ leads to large output voltage variation (i.e. large voltage change of the output voltage $V_{OUT}$). As a result, the DC-to-DC converter using the typical current-mode PWM control has poor line transient performance when the input voltage $V_{IN}$ suffers from an input voltage disturbance or transient.

Figure 4:
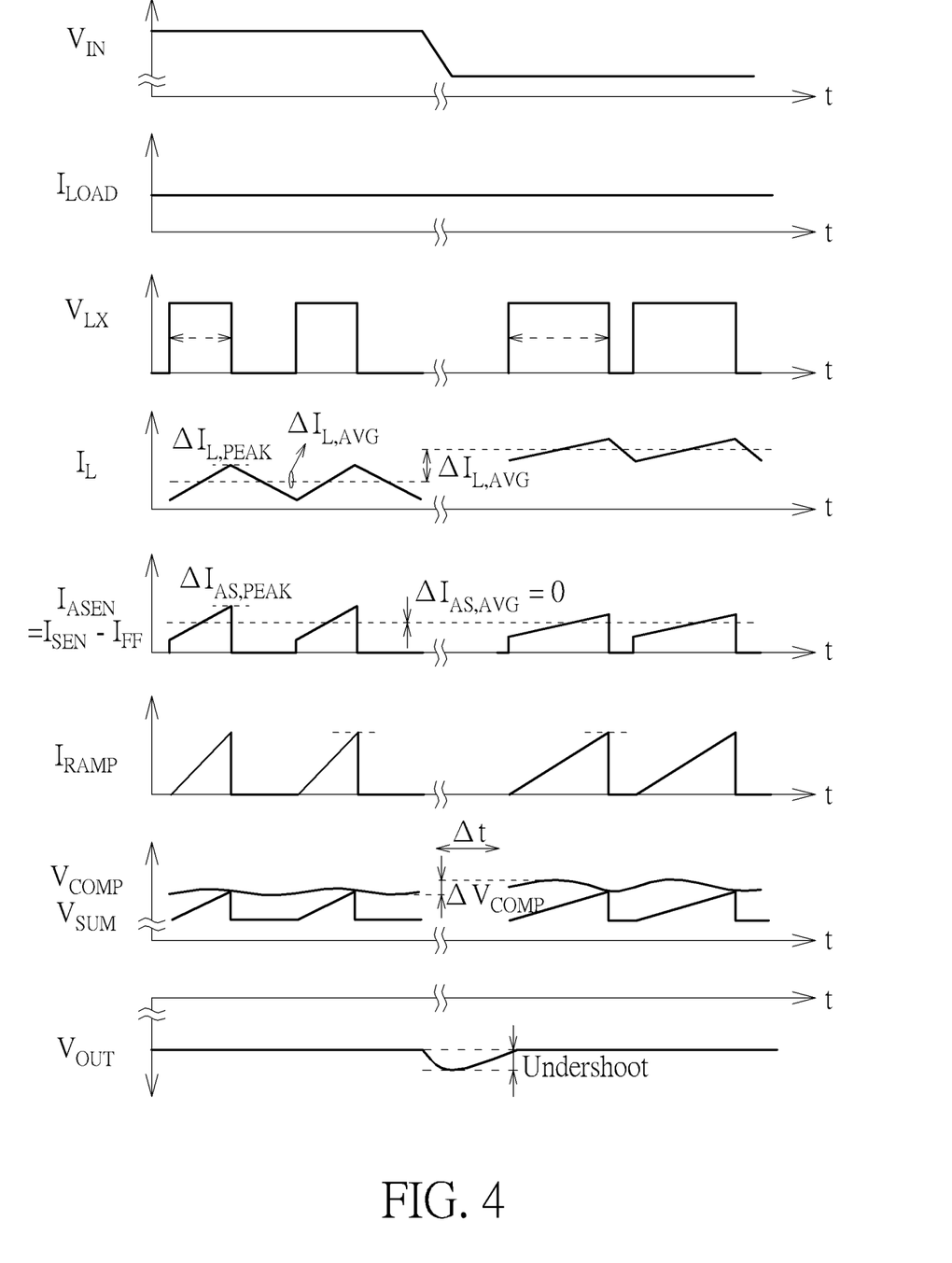
FIG. 4 is a diagram illustrating waveforms of different signals of a DC-to-DC converter under a condition of $V_{SUM}=I_{ASEN}+I_{RAMP}$ according to an embodiment of the present invention.

To address this issue, the advanced current-mode PWM control proposed by the present invention uses the sensed current signal T rather than the sensed current signal $I_{SEN}$. FIG. 4 is a diagram illustrating waveforms of different signals of a DC-to-DC converter under a condition of $V_{SUM} = I_{ASEN} + I_{RAMP}$ according to an embodiment of the present invention. As mentioned above, the input voltage $V_{IN}$ supplied from a power source (e.g., a battery module) may suffer from an input voltage disturbance or transient. Suppose that the DC-to-DC converter is an inversing buck-boost converter that operates under a continuous-conduction mode (CCM). The duty cycle D may be represented by $$D = \frac{-V_{OUT}}{V_{IN} - V_{OUT}},$$

where the input voltage $V_{IN}$ is a positive voltage (i.e. $V_{IN} > 0V$), and the output voltage $V_{OUT}$ is a negative voltage (i.e. $V_{OUT} < 0V$). In addition, the average value $I_{L,AVG}$ of the inductor current $I_L$ may be represented by $$I_{L,AVG} = \frac{I_{LOAD}}{1-D},$$

where the load current $I_{LOAD}$ drawn from the load device (e.g., AMOLED panel) has a fixed current value regardless of the input voltage $V_{IN}$. As shown in FIG. 4, when the input voltage $V_{IN}$ has an input voltage disturbance or transient (e.g., a transition from a current voltage level to a lower voltage level), the current-mode PWM control is operative to increase the duty cycle D for the same output voltage $V_{OUT}$. Hence, the peak value $I_{L,PEAK}$ and the average value $I_{L,AVG}$ of the inductor current $I_L$ are both increased.

By way of example, but not limitation, the sensed current signal $I_{ASEN}$ may be generated by subtracting an adjustment signal $I_{FF}$ from the sensed current signal $I_{SEN}$, where the sensed current signal $I_{SEN}$ is derived from sensing the inductor current $I_L$ (particularly, sensing the inductor current $I_L$ during the on-time period $t_{ON}$ of the MOS transistor DH). With a proper setting of the adjustment signal $I_{FF}$, the peak value $I_{AS,PEAK}$ and the average value $I_{AS,AVG}$ of the sensed current signal $I_{ASEN}$ do not change when the input voltage $V_{IN}$ has an input voltage disturbance or transient. Hence, the variation $\Delta I_{AS,AVG}$ of the average value $I_{AS,AVG}$ of the sensed current signal $I_{ASEN}$ is substantially zero, and the variation $\Delta I_{AS,PP}$ of peak-to-peak ripple current amplitude of the sensed current signal $I_{ASEN}$ is substantially zero.

An end point of one on-time period $t_{ON}$ of the MOS transistor DH may be aligned with a time point when a peak value of the summing signal $V_{SUM}$ reaches the error signal $V_{COMP}$. The relation between error signal $V_{COMP}$ and summing signal $V_{SUM}$ ($V_{SUM}=I_{RAMP}+(I_{SEN}-I_{FF})$) may be expressed by the following formula, where $$D = \frac{-V_{OUT}}{V_{IN} - V_{OUT}}$$

and $$I_{L,AVG} = \frac{I_{LOAD}}{1-D} \quad (2)$$

$$V_{COMP}$$
$$= V_{SUM}$$
$$= I_{RAMP} + I_{ASEN(PEAK)}$$
$$= I_{RAMP} + I_{SEN(PEAK)} - I_{FF}.$$

When the adjustment signal $I_{FF}$ is set by $$I_{FF} = I_{L,AVG} \cdot D = I_{LOAD}\left(\frac{|V_{OUT}|}{V_{IN}}\right),$$

the above formula can be rewritten as:

$$V_{COMP} = I_{RAMP} + \frac{I_{L,PP}}{2} + I_{LOAD} \quad (3)$$

Regarding the typical current-mode PWM control that directly uses the sensed current signal $I_{SEN}$, the factor $$\frac{I_{LOAD}}{1-D}$$

in formula (1) dominates the variation $\Delta V_{COMP}$ of the error signal $V_{COMP}$. However, with the cancellation factor $I_{FF}$ intentionally introduced, the sensed current signal $I_{ASEN}$ $$\left(I_{ASEN} = \frac{I_{L,PP}}{2} + I_{LOAD}\right)$$

has an average value being a constant regardless of the input voltage of the DC-to-DC converter, and the factor $$\frac{I_{LOAD}}{1-D}$$

does not exist in formula (3). Since the variation $\Delta I_{AS,AVG}$ of the sensed current signal $I_{ASEN}$ is substantially zero, the variation $\Delta V_{COMP}$ of the error signal $V_{COMP}$ induced due to the sudden change of the input voltage $V_{IN}$ is small (i.e. $\Delta V_{COMP} \approx \Delta I_{AS,PP} \approx 0$). To put it another way, the variation $\Delta V_{COMP}$ of the error signal $V_{COMP}$ can be cancelled or mitigated by the variation $\Delta I_{FF}$ of the intentionally introduced adjustment signal $I_{FF}$. It should be noted that subtracting the adjustment signal $I_{FF}$ from the sensed current signal $I_{SEN}$ is one example of generating the sensed current signal $I_{ASEN}$ with a constant average value. In practice, any means capable of processing the sensed current signal $I_{SEN}$ to generate the sensed current signal $I_{ASEN}$ with a constant average value may be employed by the proposed advanced current-mode PWM control. When the input voltage VIN has an input voltage disturbance or transient, the small variation $\Delta V_{COMP}$ within the time period $\Delta t$ leads to small output voltage variation (i.e. small voltage change of the output voltage $V_{OUT}$). In this way, the DC-to-DC converter using the proposed advanced current-mode PWM control has good line transient performance when the input voltage $V_{IN}$ suffers from an input voltage disturbance or transient.

Figure 5:
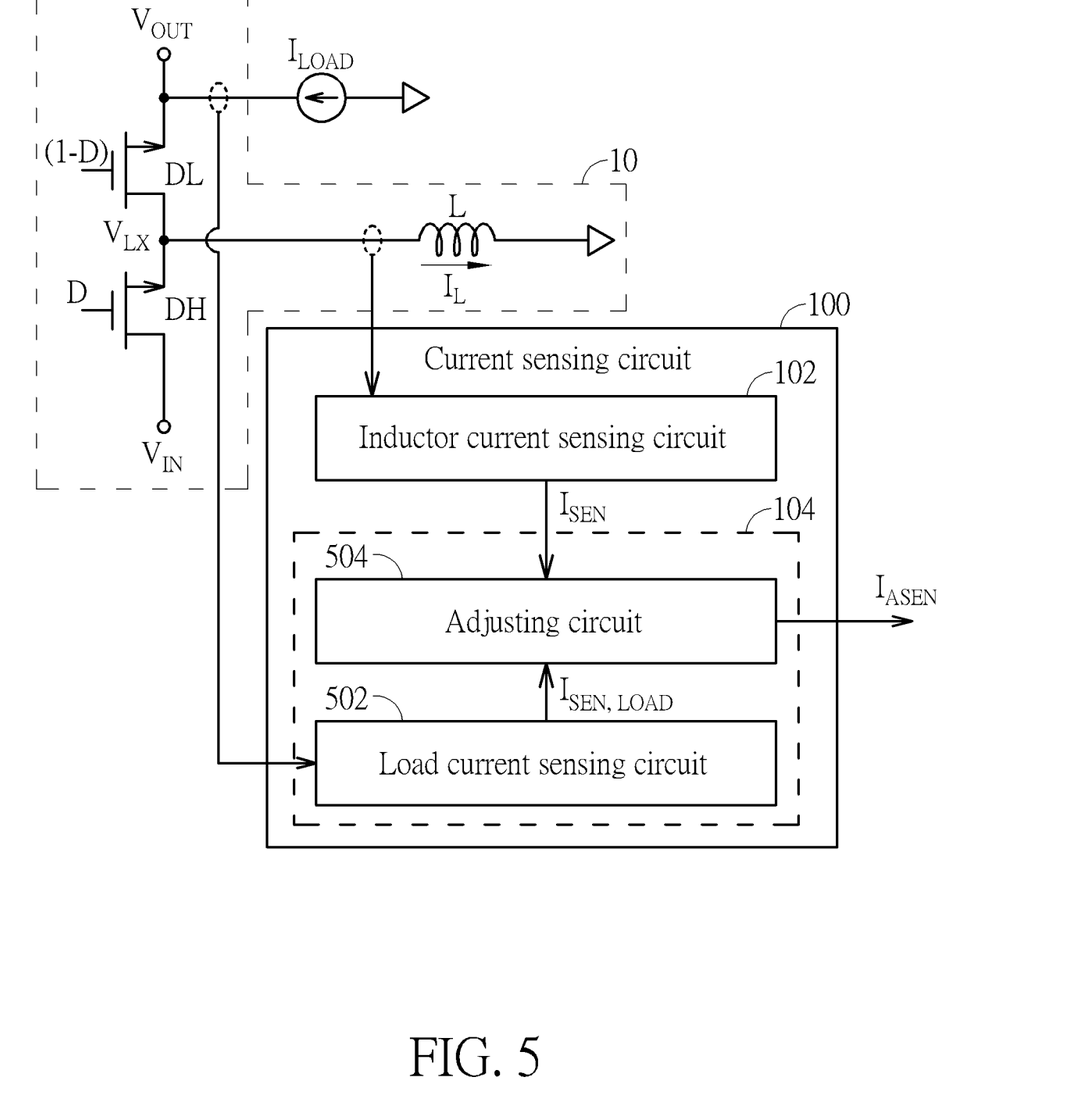
FIG. 5 is a diagram illustrating a first exemplary design of the current sensing circuit shown in FIG. 1 according to an embodiment of the present invention.

As mentioned above, the processing circuit 104 is designed for generating the sensed current signal $I_{ASEN}$ as a sensing output of the current sensing circuit 100, wherein an average value of the sensed current signal $I_{ASEN}$ is a constant under different input voltages $V_{IN}$ of the DC-to-DC converter (e.g. inverting buck-boost converter). FIG. 5 is a diagram illustrating a first exemplary design of the current sensing circuit shown in FIG. 1 according to an embodiment of the present invention. The processing circuit 104 may be configured to include a load current sensing circuit 502 and an adjusting circuit 504. The load current sensing circuit 502 is arranged to sense the load current $I_{LOAD}$ of the DC-to-DC converter (e.g., inverting buck-boost converter) to generate a sensed current signal $I_{SEN,LOAD}$. For example, the load current sensing circuit 502 may be implemented by a current sensing amplifier used to sense the load current $I_{LOAD}$ that has a fixed current value regardless of the input voltage $V_{IN}$. The sensed current signal $I_{SEN,LOAD}$ may be expressed in "voltage" form or "current" form, depending upon actual design consideration. The adjusting circuit 504 is arranged to derive an alternating current (AC) component $I_{SEN,AC}$ from the sensed current signal $I_{SEN}$, and generate the sensed current signal $I_{ASEN}$ by combining the sensed current signal $I_{SEN,LOAD}$ and the AC component $I_{SEN,AC}$, that is, $I_{ASEN}=I_{SEN,AC}+I_{SEN,LOAD}$. For example, the AC component $I_{SEN,AC}$ may be equal to a half of peak-to-peak ripple current amplitude of the sensed current signal $I_{SEN}$. The sensed current signal $I_{ASEN}$ includes information of the inductor current $I_L$ for current-mode PWM control, but is free from the input-voltage-dependent factor $$\frac{I_{LOAD}}{1-D}$$

that significantly degrades the line transient performance. In other words, the DC-to-DC converter (e.g., inverting buck-boost converter) retains weighting of current information and current-mode characteristic (e.g. saving the hardware compensation cost), and reduces variation $\Delta V_{COMP}$ of the error signal $V_{COMP}$ for improving the line regulation/transient performance. Furthermore, the current sensing circuit 100 shown in FIG. 5 can be implemented using a single circuit design.

Figure 6:
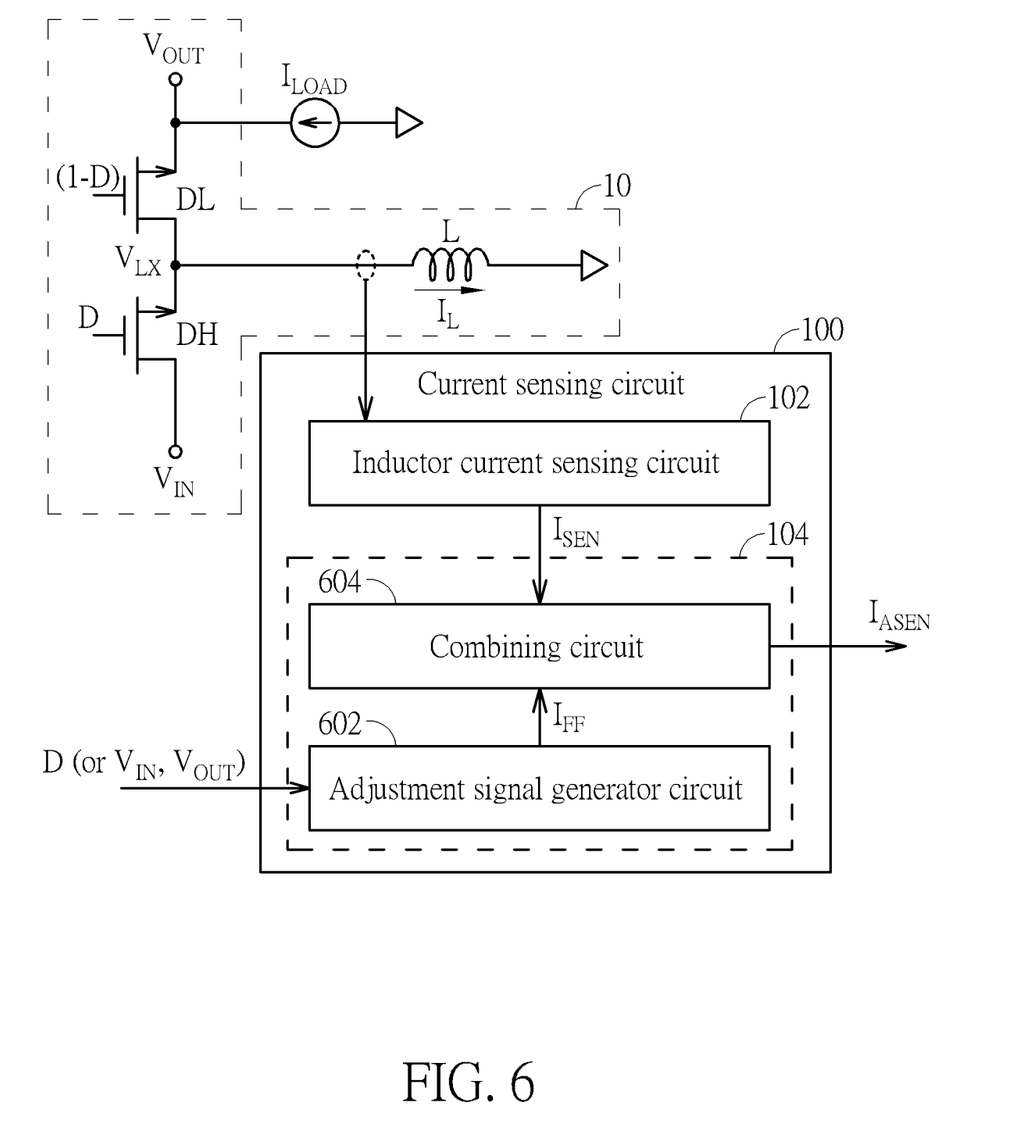
FIG. 6 is a diagram illustrating a second exemplary design of the current sensing circuit shown in FIG. 1 according to an embodiment of the present invention.

FIG. 6 is a diagram illustrating a second exemplary design of the current sensing circuit shown in FIG. 1 according to an embodiment of the present invention. The processing circuit 104 may be configured to include an adjustment signal generator circuit 602 and a combining circuit 604. The adjustment signal generator circuit 602 is arranged to generate an adjustment signal $I_{FF}$. The adjustment signal $I_{FF}$ may be expressed in "voltage" form or "current" form, depending up actual design considerations. The combining circuit 604 is arranged to generate the sensed current signal $I_{ASEN}$ by subtracting the adjustment signal $I_{FF}$ from the sensed current signal $I_{SEN}$, that is, $I_{ASEN}=I_{SEN}-I_{FF}$. For example, the adjustment signal generator circuit 602 may generate the adjustment signal $I_{FF}$ according to an average value of the sensed current signal $I_{SEN}$ and the duty cycle D controlled by the current-mode PWM control. In a case where the DC-to-DC converter is an inversing buck-boost converter that operates under CCM, the duty cycle D may be represented by $$D = \frac{-V_{OUT}}{V_{IN} - V_{OUT}}.$$

Alternatively, the adjustment signal generator circuit 602 may generate the adjustment signal $I_{FF}$ according to the load current $I_{LOAD}$ of the DC-to-DC converter, the input voltage $V_{IN}$ of the DC-to-DC converter, and the output voltage $V_{OUT}$ of the DC-to-DC converter. The sensed current signal $I_{ASEN}$ includes information of the inductor current $I_L$ for current-mode PWM control, but is free from the input-voltage-dependent factor $$\frac{I_{LOAD}}{1-D}$$

that significantly degrades the line transient performance. In other words, the DC-to-DC converter (e.g., inverting buck-boost converter) retains weighting of current information and current-mode characteristic (e.g. saving the hardware compensation cost), and reduces variation $\Delta V_{COMP}$ of the error signal $V_{COMP}$ for improving the line regulation/transient performance. Furthermore, the current sensing circuit 100 shown in FIG. 6 can be implemented using a single circuit design.

The embodiments shown in FIG. 5 and FIG. 6 are for illustrative purposes only, and are not meant to be limitations of the present invention. As long as the sensed current signal $I_{ASEN}$ (which is derived from the sensed current signal $I_{SEN}$) has an average value being a constant under different input voltages $V_{IN}$, the variation $\Delta V_{COMP}$ of the error signal $V_{COMP}$ can be mitigated to reduce the output voltage variation, as illustrated in FIG. 4. In practice, any current-mode PWM controller using the sensed current signal $I_{ASEN}$ with a constant average value falls within the scope of the present invention.

For brevity and simplicity, the above assumes that the DC-to-DC converter using the proposed current-mode control design is an inverting buck-boost converter. However, this is not meant to be a limitation of the present invention. In practice, any DC-to-DC converter using the sensed current signal $I_{ASEN}$ for current-mode PWM control falls within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A current sensing circuit comprising:
   an inductor current sensing circuit, arranged to sense an inductor current of a direct current to direct current (DC-to-DC) converter to generate a first sensed current signal, wherein an average value of the first sensed current signal is not a constant under different input voltages of the DC-to-DC converter; and
   a processing circuit, arranged to generate a second sensed current signal, wherein the first sensed current signal is involved in generation of the second sensed current signal, the second sensed current signal is involved in current-mode control of the DC-to-DC converter, and an average value of the second sensed current signal is a constant under said different input voltages of the DC-to-DC converter.

2. The current sensing circuit of claim 1, wherein the processing circuit comprises:
   a load current sensing circuit, arranged to sense a load current of the DC-to-DC converter to generate a third sensed current signal; and
   an adjusting circuit, arranged to derive an alternating current (AC) component from the first sensed current signal, and generate the second sensed current signal by combining the third sensed current signal and the AC component.

3. The current sensing circuit of claim 2, wherein the AC component is equal to a half of peak-to-peak ripple current amplitude of the first sensed current signal.

4. The current sensing circuit of claim 1, wherein the processing circuit comprises:
   an adjustment signal generator circuit, arranged to generate an adjustment signal; and
   a combining circuit, arranged to generate the second sensed current signal by subtracting the adjustment signal from the first sensed current signal.

5. The current sensing circuit of claim 4, wherein the adjustment signal generator circuit generates the adjustment signal according to the average value of the first sensed current signal and a duty cycle controlled by said current-mode control.

6. The current sensing circuit of claim 4, wherein the adjustment signal generator circuit generates the adjustment signal according to a load current of the DC-to-DC converter, an input voltage of the DC-to-DC converter, and an output voltage of the DC-to-DC converter.

7. The current sensing circuit of claim 1, wherein the DC-to-DC converter is an inverting buck-boost converter.

8. A current-mode control circuit of a direct current to direct current (DC-to-DC) converter comprising:
   an error amplifier circuit, arranged to receive a feedback voltage of the DC-to-DC converter and a reference voltage, and generate an error signal according to the feedback voltage and the reference voltage;

a current sensing circuit, comprising:
  an inductor current sensing circuit, arranged to sense an inductor current of the DC-to-DC converter to generate a first sensed current signal, wherein an average value of the first sensed current signal is not a constant under different input voltages of the DC-to-DC converter; and
  a processing circuit, arranged to generate a second sensed current signal, wherein the first sensed current signal is involved in generation of the second sensed current signal, and an average value of the second sensed current signal is a constant under said different input voltages of the DC-to-DC converter;
a ramp generator circuit, arranged to generate a ramp signal;
a first combining circuit, arranged to combine the second sensed current signal and the ramp signal to generate a summing signal; and
a comparator circuit, arranged to receive the error signal and the summing signal, and generate a control signal according to the error signal and the summing signal, wherein an output voltage of the DC-to-DC converter depends on the control signal.

9. The current-mode control circuit of claim 8, wherein the processing circuit comprises:
  a load current sensing circuit, arranged to sense a load current of the DC-to-DC converter to generate a third sensed current signal; and
  an adjusting circuit, arranged to derive an alternating current (AC) component from the first sensed current signal, and generate the second sensed current signal by combining the third sensed current signal and the AC component.

10. The current-mode control circuit of claim 9, wherein the AC component is equal to a half of peak-to-peak ripple current amplitude of the first sensed current signal.

11. The current-mode control circuit of claim 8, wherein the processing circuit comprises:
  an adjustment signal generator circuit, arranged to generate an adjustment signal; and
  a second combining circuit, arranged to generate the second sensed current signal by subtracting the adjustment signal from the first sensed current signal.

12. The current-mode control circuit of claim 11, wherein the adjustment signal generator circuit generates the adjustment signal according to the average value of the first sensed current signal and a duty cycle controlled by the control signal.

13. The current-mode control circuit of claim 11, wherein the adjustment signal generator circuit generates the adjustment signal according to a load current of the DC-to-DC converter, an input voltage of the DC-to-DC converter, and an output voltage of the DC-to-DC converter.

14. The current-mode control circuit of claim 8, wherein the DC-to-DC converter is an inverting buck-boost converter.

* * * * *